(12) United States Patent
Lu et al.

(10) Patent No.: US 8,650,511 B2
(45) Date of Patent: Feb. 11, 2014

(54) LITHOGRAPHY PERFORMANCE CHECK METHODS AND APPARATUS

(75) Inventors: Chi-Ta Lu, Sanxing Township, Yilan County (TW); Peng-Ren Chen, Hsinchu (TW); Dong-Hsu Cheng, Tainan (TW); Chang-Jyh Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 394 days.

(21) Appl. No.: 12/770,903

(22) Filed: Apr. 30, 2010

(65) Prior Publication Data

US 2011/0271239 A1 Nov. 3, 2011

(51) Int. Cl.
*G06F 17/50* (2006.01)

(52) U.S. Cl.
USPC .............................. 716/53; 716/52

(58) Field of Classification Search
USPC ....................................... 716/52, 53
See application file for complete search history.

(56) References Cited

U.S. PATENT DOCUMENTS

| | | | |
|---|---|---|---|
| 2007/0265725 A1 | 11/2007 | Liu et al. | |
| 2007/0266352 A1 | 11/2007 | Cheng et al. | |
| 2007/0266362 A1* | 11/2007 | Lai et al. | 716/19 |
| 2008/0005704 A1* | 1/2008 | Miloslavsky et al. | 716/2 |
| 2008/0301623 A1 | 12/2008 | Tsai et al. | |
| 2009/0300561 A1* | 12/2009 | Tong et al. | 716/5 |
| 2010/0333049 A1* | 12/2010 | Agarwal et al. | 716/55 |
| 2011/0047520 A1* | 2/2011 | Chew et al. | 716/52 |
| 2011/0119642 A1* | 5/2011 | Agarwal et al. | 716/50 |
| 2012/0007874 A1 | 1/2012 | Holcomb | |

OTHER PUBLICATIONS

Kang et al.; "Combination of rule and pattern based lithography unfriendly pattern detection in OPC flow"; 2008; SPIE; pp. 1-8.*
Hung et al.; "Post-OPC verification using a full-chip patter-based simulation verification method"; 2005; SPIE; 25th Annual BACUS Symposium on Photomask Technology; pp. 1-8.*
Kobayashi et al.; "Process window aware layout optimization using hot spot fixing system"; 2007; SPIE; Design for Manufacturability the Design Process Integration; pp. 1-10.*

* cited by examiner

*Primary Examiner* — Suresh Memula
(74) *Attorney, Agent, or Firm* — Haynes and Boone, LLP

(57) ABSTRACT

The present disclosure provides for many different embodiments. A mask fabrication method and system is provided. The method and system identify critical areas of an integrated circuit (IC) design layout that has undergone optical proximity correction. The critical areas are areas of the OPCed IC design layout that are at risk for hot spots. A lithography process check is then performed on the critical areas of the OPCed IC design layout.

20 Claims, 6 Drawing Sheets

LITHOGRAPHY PERFORMANCE CHECK METHODS AND APPARATUS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as IC technologies are continually progressing to smaller technology nodes, such as 65 nm technology node, 45 nm technology node, and below, simply scaling down similar designs used at larger feature sizes often results in hot spots or problem areas in the device. Hot spots refer to characteristics of the device that prevent the device from performing as desired. Examples of hot spots include pinching, necking, bridging, dishing, erosion, RC delay, metal line thickness variations, Cu residue, and other characteristics that affect device performance. These hot spots can be due to the circuit design and/or the process controls. Although existing methods for detecting and correcting hot spots have been generally adequate for their intended purposes, they have not been entirely satisfactory in all respects.

SUMMARY

The present disclosure provides for many different embodiments. According to one of the broader forms of an embodiment of the invention, a method includes: receiving an integrated circuit (IC) design layout; performing an optical proximity correction (OPC) on the IC design layout; identifying a critical area of the OPCed IC design layout; providing a simulated IC pattern of the critical area of the OPCed IC design layout; determining whether the simulated IC pattern of the critical area exhibits a hot spot; and modifying the critical area of the OPCed IC design layout if the simulated IC pattern of the critical area exhibits a hot spot. A mask may be fabricated according to the OPCed IC design layout.

According to another of the broader forms of an embodiment of the invention, a method includes: receiving an integrated circuit (IC) design layout; applying an optical proximity correction (OPC) modification to the IC design layout; identifying a critical area of the OPC-modified IC design layout; and applying a lithography process check (LPC) modification to the OPC-modified IC design layout if the critical area of the OPC-modified IC design layout exhibits a hotspot. In furtherance of the embodiment, a mask may be fabricated according to the LPC-and-OPC-modified IC design layout.

According to yet another of the broader forms of an embodiment of the invention, an apparatus has a computer-readable medium that includes instructions executable by a processor. The instructions perform optical proximity correction (OPC) on an IC design layout, thereby creating an OPCed IC design layout; identify a portion of the OPCed IC design layout; and perform lithography process check (LPC) on the portion of the OPCed IC design layout, thereby creating an OPCed-LPCed IC design layout. The instructions may further fabricate a mask using the OPCed-LPCed IC design layout.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
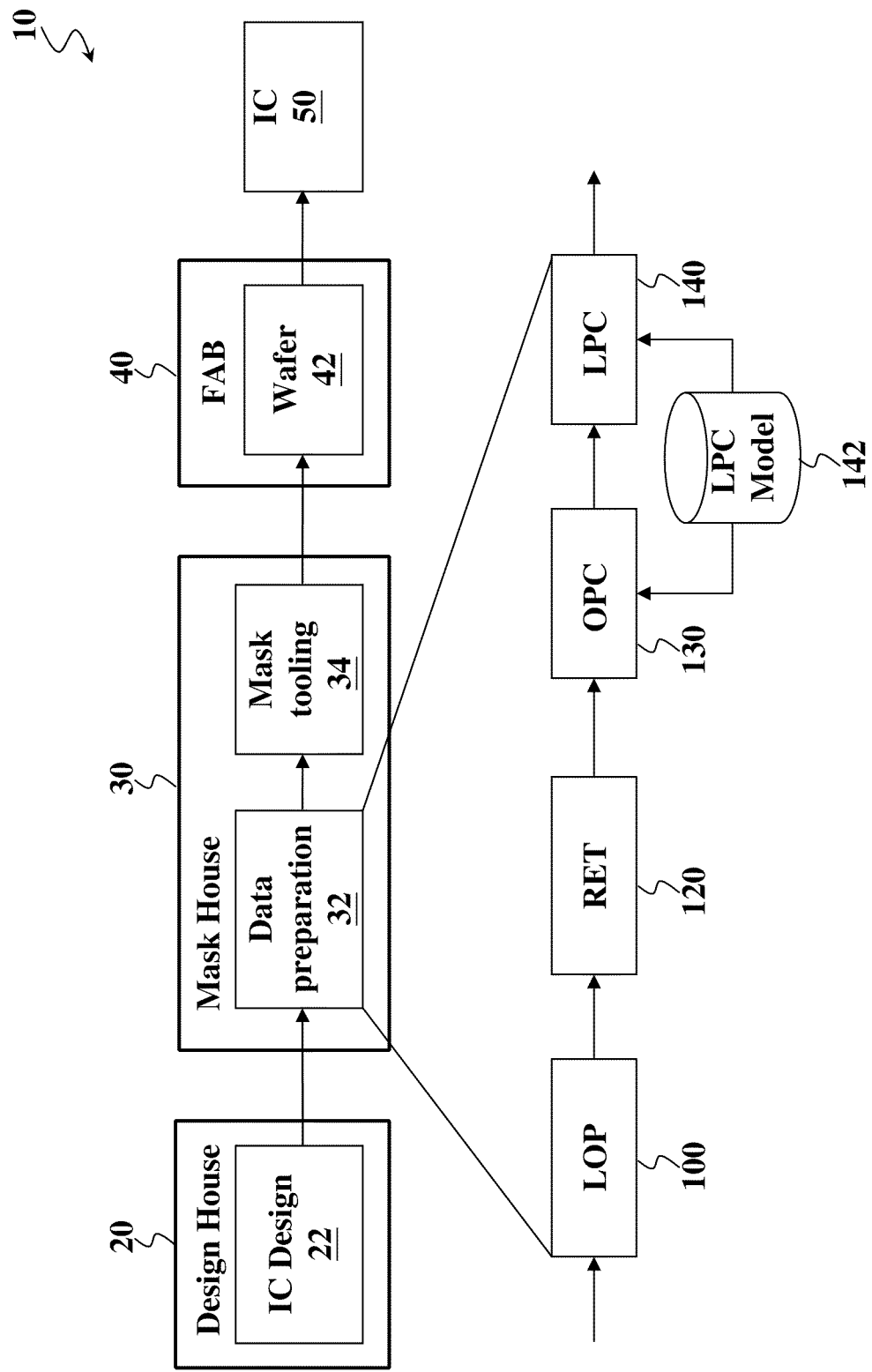
FIG. 1 is a simplified block diagram of an embodiment of an integrated circuit (IC) manufacturing system and an associated IC manufacturing flow.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an embodiment of an integrated circuit (IC) manufacturing system 10 and an IC manufacturing flow associated with the IC manufacturing system 10. The IC manufacturing system 10 includes a plurality of entities, such as a design house 20, a mask house 30, and an IC manufacturer 40, that interact with one another in the design, development, and manufacturing cycles and/or services related to manufacturing an integrated circuit (IC) device 50. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 20, mask house 30, and IC manufacturer 40 may be a single entity or separate entities.

The design house (or design team) 20 generates an IC design layout 22. The IC design layout 22 includes various geometrical patterns designed for an IC product, based on a specification of the IC product to be manufactured. The geometrical patterns correspond to patterns of metal, oxide, or semiconductor layers that make up the various components of the IC device 50 to be fabricated. The various layers combine to form various IC features. For example, a portion of the IC design layout 22 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 20 implements a proper design procedure to form the IC design layout 22. The design procedure may include logic design, physical design, and/or place and route. The IC design layout 22 is presented in one or more data files having information of the geometrical patterns. For example, the IC design layout 22 can be expressed in a GDSII file format (or DFII file format).

The mask house 30 uses the IC design layout 22 to manufacture one or more masks to be used for fabricating the various layers of the IC product according to the IC design layout 22. The mask house 30 performs mask data preparation 32, where the IC design layout 22 is translated into a form that can be physically written by a mask writer, and mask tooling 34, where the design layout prepared by the mask data preparation 32 is modified to comply with a particular mask writer and/or mask manufacturer. In the present embodiment, the mask data preparation 32 and mask tooling 34 are illustrated as separate elements, however, the mask data preparation 32 and mask tooling 34 can be collectively referred to as mask data preparation, which can further include mask fabrication.

The mask data preparation 32 includes a logic operation (LOP) 100, a retarget process (RET) 120, an optical proximity correction (OPC) 130, and a lithography process check (LPC) 140. The LOP 100 is performed on the IC design layout 22 to modify the IC design layout 22 according to manufacturing rules. Various manufacturer modules convert manufacturing constraints into a set of rules that the IC design layout 22 has to meet. If the IC design layout 22 does not meet this set of rules, the IC design layout 22 will be modified accordingly until the modified IC design layout meets these rules. Such modification is implemented by the logic operation 100.

RET 120 and OPC 130 are resolution enhancement techniques. RET 120 can modify the IC design layout 22 to compensate for limitations in lithographic processes used to manufacture the IC product according to the IC design layout 22. OPC 130 is a lithography enhancement technique used to compensate for image errors, such as those that can arise from diffraction, interference, or other process effects. RET 120 and OPC 130 features, such as scattering bars, serif, and/or hammerheads, are added to the IC design layout 22 according to optical models or rules such that, after a lithography process, a final pattern on a wafer is improved with enhanced resolution and precision. The mask data preparation 32 can include further resolution enhancement techniques, such as off-axis illumination, sub-resolution assist features, phase-shifting masks, other suitable techniques, or combinations thereof.

LPC 140 simulates processing that will be implemented by the IC manufacturer 40 to fabricate the IC device 50. LPC 140 simulates this processing based on the IC design layout 22 to create a simulated manufactured device, such as the IC device 50. The simulated manufactured device may be all or a portion of the IC design layout. In the present embodiment, the LPC 140 simulates processing of the modified IC design layout, which has been subjected to the LOP 100, RET 120, and OPC 130. Accordingly, the modified IC design layout is also referred to as the OPCed IC design layout. LPC 140 uses one or more LPC models (or rules) 142. The LPC models (or rules) 142 may be based on actual processing parameters of the IC manufacturer 40. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

Figure 2:
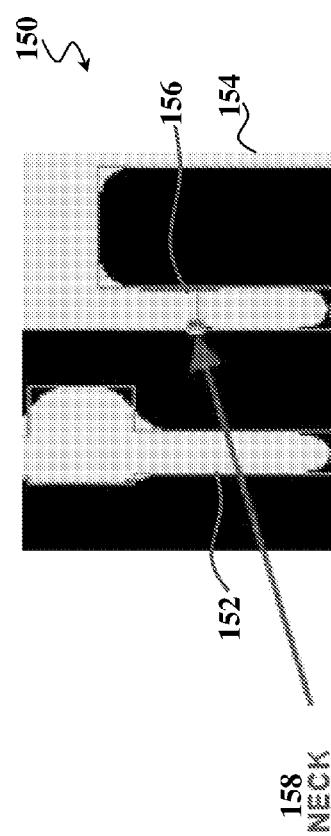
FIG. 2 is a top view of a portion of an integrated circuit device pattern simulated by a lithography process check that exhibits a necking/pinching hot spot.
Figure 3:
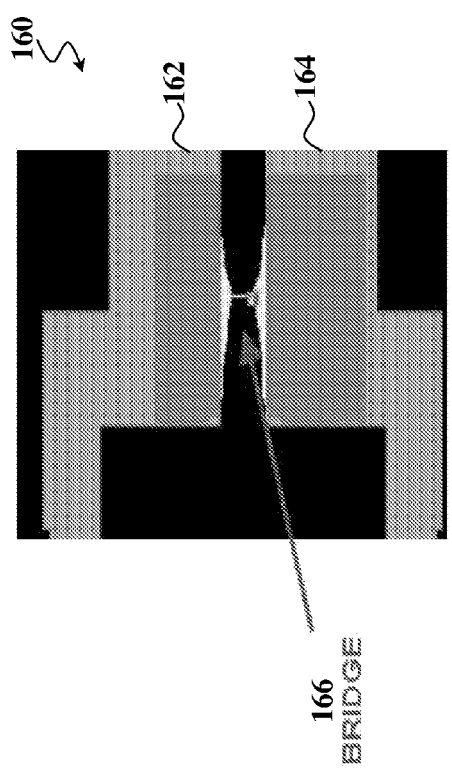
FIG. 3 is a top view of a portion of an integrated circuit device pattern simulated by a lithography process check that exhibits a bridging hot spot.

LPC 140 uses the simulated manufactured device to inspect the IC design layout 22, or more specifically, the OPCed IC design layout, for hot spots. Hot spots refer to characteristics of the IC device that negatively affect the device's performance. Examples of hot spots include pinching/necking, bridging, dishing, erosion, RC delay, line thickness variations, Cu residue, and other characteristics. Hot spots can arise from the circuit design and/or process controls. FIG. 2 is a top view of a portion of an integrated circuit device pattern 150 simulated by LPC 140 that exhibits a necking/pinching hot spot. The portion of the integrated circuit device pattern 150 includes a metal line 152 and metal line 154 on either side of a metal line 156, and exhibits a pinching/necking effect 158 along the metal line 156. Pinching hot spots, such as that illustrated in FIG. 2, can result undesirably in open circuits. FIG. 3 is a top view of a portion of an integrated circuit device pattern 160 simulated by LPC 140 that exhibits a bridging hot spot. The portion of the integrated circuit device pattern 160 includes a metal line 162 and a metal line 164 spaced closely to one another, and exhibits a bridging effect 166 between the metal lines 162 and 164. Bridging hot spots, such as that illustrated in FIG. 3, can result undesirably in short circuits. Both the necking effect 158 and bridging effect 166 may be caused by numerous factors including but not limited to layout design, processing controls, inadequate line spacing, dishing, erosion, line thickness variations, and/or the presence of Cu residue.

LPC 140 detects hot spots by determining whether the simulated manufactured device complies with a set of hot spot rules. This is achieved by comparing parameters of the simulated manufactured device with a plurality of hot spot rules and/or specifications. The hot spot rules/specifications can be stored in a database accessible by the LPC 140. The hot spot rules may be organized based on processing type, layout designs, feature sizes, and/or other appropriate groupings. The hot spot rules can be predefined, or alternatively, are definable. Exemplary hot spot rules include a minimum density rule, a minimum line spacing rule, RC characteristic parameters, and other suitable hot spot rules. LPC 140 determines whether the simulated manufactured device violates any of the plurality of hot spot rules. If the simulated manufactured device satisfies the hot spot rules, the mask data preparation 32 is completed, and the IC design layout 22, more particularly, the OPCed IC design layout undergoes further processing in the mask tooling 34. Alternatively, the OPCed IC design layout is subjected to further model-based testing, rule-based testing, and/or otherwise modified or tested to further improve the design and/or layout of the device before the manufacturing phase. If the simulated manufactured device does not satisfy the hot spot rules, then the LPC 140 modifies the OPCed IC design layout to comply with the hot spot rules, and the modified OPCed/LPCed IC design layout undergoes further processing in mask tooling 34.

After mask data preparation 32 and mask tooling 34, a mask or group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

The IC manufacturer 40, such as a semiconductor foundry, uses the mask (or masks) fabricated by the mask house 30 to fabricate the IC device 50. The IC manufacturer 40 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 50. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes.

Figure 4:
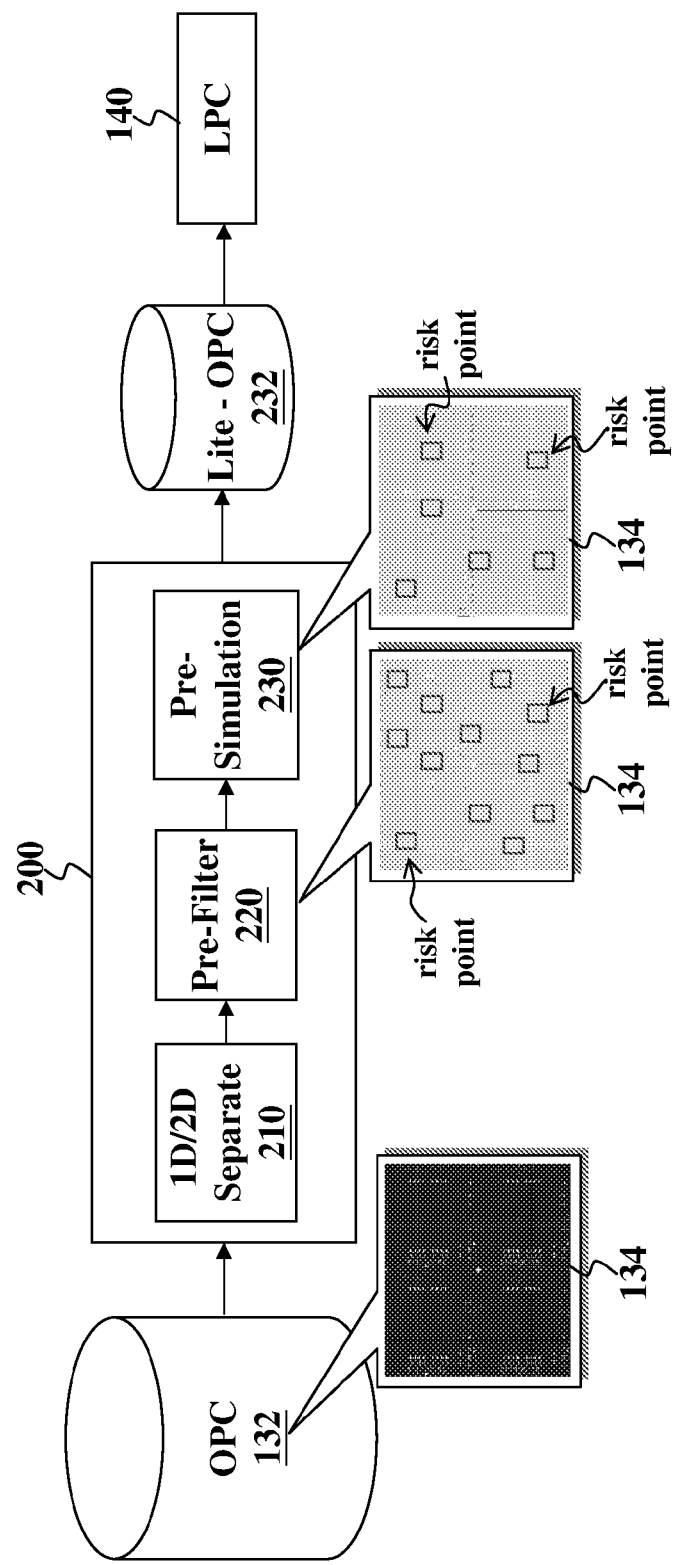
FIG. 4 is a simplified block diagram of an embodiment of an lithography process check flow.

FIG. 4 is a simplified block diagram of an embodiment of an improved lithography process check (LPC) flow 200. The LPC flow 200 of FIG. 4 can be implemented by the IC manufacturing system 10 and associated IC manufacturing flow of FIG. 1, for example, in the mask data preparation process. Conventional LPC processes, such as LPC 140 (FIG. 1), perform a full IC device simulation (i.e., for example, a full IC device simulation based on the OPCed design layout). This can be time consuming and costly. More particularly, conventional LPC processes have an undesirably long cycle time, sometimes failing to provide hot spot information before a mask is manufactured according to the IC design layout, or even before the final IC device is manufactured. By performing a full IC device simulation, the conventional LPC processes waste time by simulating patterns of the IC device that are considered safe, or not at risk for hot spots, such as necking and/or bridging. For example, patterns having large critical dimensions are usually not at risk for necking issues, patterns having large spaces are not usually at risk for bridging issues, and corner patterns that exhibit corner rounding are not usually at risk for necking. Accordingly, it would be advantageous to filter out such non-risky, or non-critical areas, so that the LPC process simulates patterns in areas at risk for hot spots.

Figure 5:
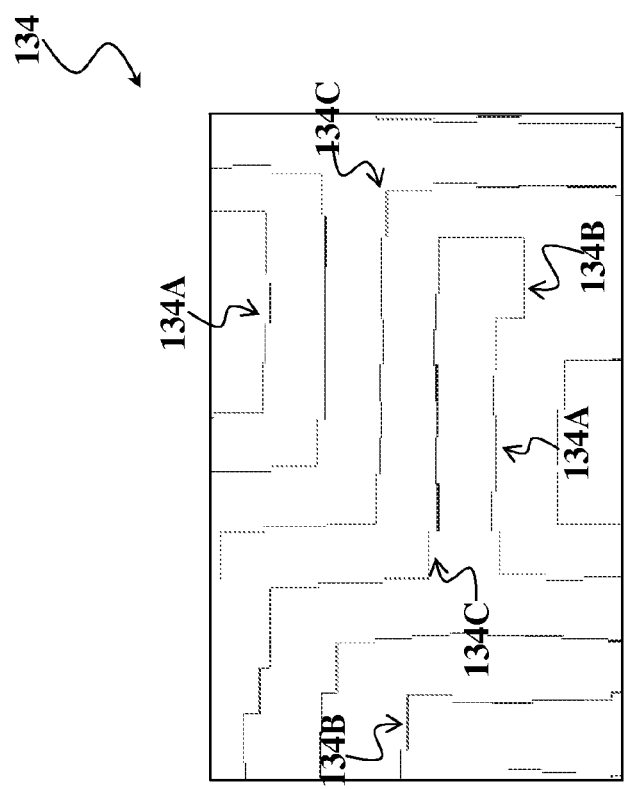
FIG. 5 is a top view of a portion of an IC design layout constructed according to the lithography process check flow of FIG. 4.

The depicted embodiment implements the LPC process flow 200, which finds critical areas of the IC design layout. Critical areas of the IC design layout are areas where the IC pattern may be at risk for hot spots. The LPC process, such as LPC process 140, then simulates critical areas of the pattern for hot spot inspection. More specifically, after the IC design layout 22 has undergone OPC 130, the OPC 130 has a database 132 that stores the OPCed IC design layout 134. At block 210 of the improved LPC process 200, the OPCed IC design layout 134 is separated into various pattern categories. For example, the patterns of the OPCed IC design layout 134 are separated into one-dimensional (1D) and two-dimensional (2D) edges. FIG. 5 is a portion of the OPCed IC design layout 134 that identifies 1D lines 134A, 2D outer (concave) corners 134B, and 2D inner (convex) corners 134C. The pattern categories illustrated here are not limited by the present example and include any suitable pattern category, which can be selected based on the hot spot issues of concern.

At block 220 of the improved LPC process 200, a pre-filtering process is performed on the categorized OPCed IC design layout 134 to identify critical areas of the OPCed IC design layout 134. Various criteria are applied to each pattern category of the OPCed IC design layout 134 in the pre-filtering process. The various criteria define pattern parameters that identify critical and non-critical patterns. The non-critical patterns are patterns/areas of the OPCed IC design layout 134 where the pattern does not exhibit a risk for having hot spots. The critical patterns are areas of the OPCed IC design layout 134 where the pattern exhibits a risk for hot spots. Accordingly, the pre-filtering process identifies risk points (or areas) in the OPCed IC design layout 134.

Since different patterns (or categories) have different characteristics, different criteria can be defined for each category. In the present embodiment, the criteria defines 1D parameters that identify isolated lines, semi-isolated lines, and/or dense lines in the OPCed IC design layout 134. For example, a set of rules could define isolated lines as lines having spaces on each side that are greater than about 140 nm, dense lines as having spaces on each side that are less than about 140 nm, and semi-isolated lines as having a space on one side that is greater than about 140 nm and a space on the other side that is less than 140 nm. After the 1D patterns are classified as isolated, semi-isolated, or dense lines, further criteria can be applied to the lines to identify critical line patterns that are at risk for exhibiting hot spot effects. For example, the criteria can further specify that isolated lines are not considered risky, semi-isolated lines having a critical dimension greater than about 80 nm are risky, and dense lines having a critical dimension greater than about 75 nm are risky. When these criteria are applied in the pre-filtering process, isolated lines, semi-isolated lines having critical dimensions less than about 80 nm, and dense lines having critical dimensions less than about 75 nm are identified as non-critical. Similarly, the semi-isolated lines with critical dimensions greater than about 80 nm and dense lines having critical dimensions greater than about 75 nm are identified as critical.

Figure 6:
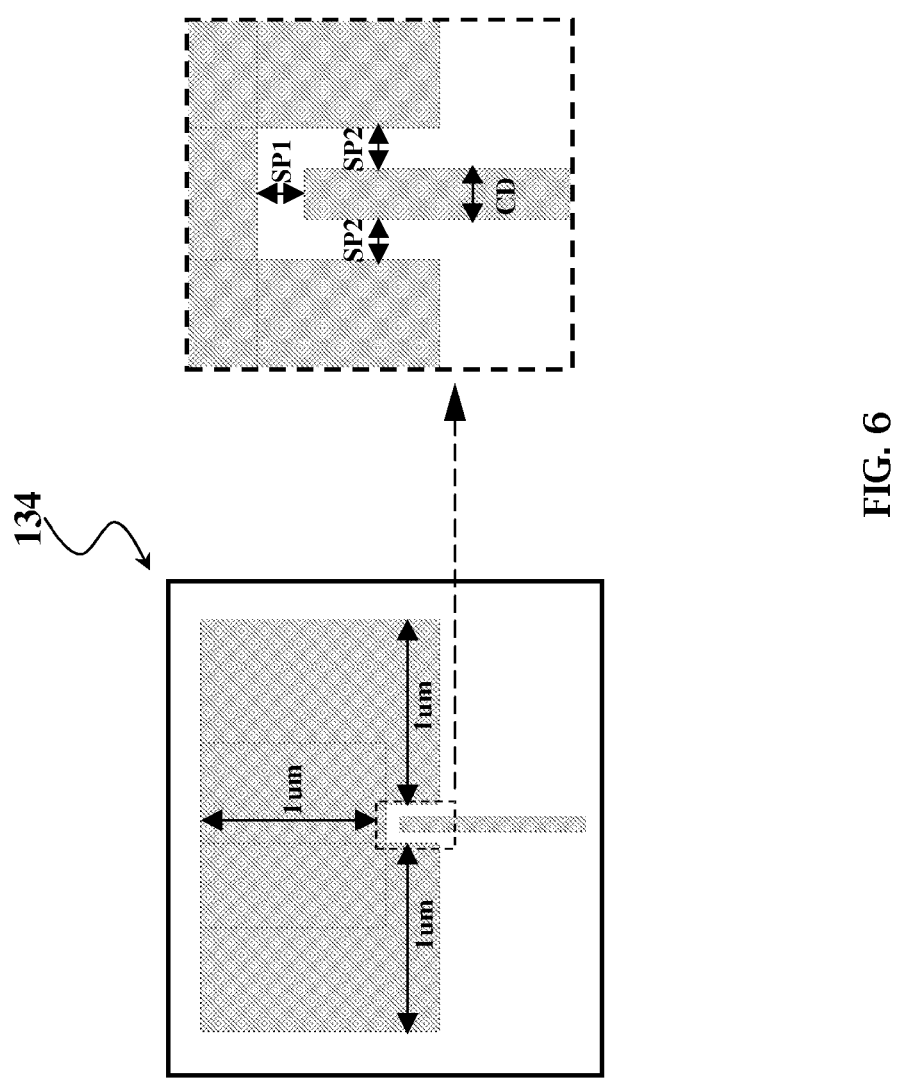
FIG. 6 is a top view of a portion of an IC design layout constructed according to the lithography process check flow of FIG. 4.

In furtherance of the present embodiment, the criteria defines 2D parameters that identify end types that are critical (or risky). FIG. 6 is a portion of the OPCed IC design layout 134 that is a 2D pattern end that may exhibit bridging issues. The 2D pattern end includes a split critical dimension (CD) parameter, a first space (SP1) parameter, and a second space (SP2) parameter. In the present embodiment, the criteria specifies CD, SP1, and SP2 values that are considered critical (i.e., at risk for exhibiting hot spots) or non-critical. For example, the criteria defines non-critical end type patterns as having a CD less than about 80 nm, a SP1 greater than about 80 nm, and a SP2 greater than about 80 nm. When these criteria are applied in the pre-filtering process, end type patterns that have a CD less than about 80 nm, SP1 greater than about 80 nm, and SP2 greater than about 80 nm are identified as non-critical, and end type patterns that do not meet these parameters are identified as critical. As illustrated in FIG. 4, after the pre-filtering process at block 220 is performed, critical areas (indicated as risk points) of the OPCed IC design layout 134 are identified.

At block 230 of the improved LPC process 200, a pre-simulation process is performed on the critical areas (patterns) identified in the pre-filtering process at block 220. This provides further filtering, reducing the number of critical areas (patterns) for simulation by the LPC 140. The pre-simulation process is a wafer simulation of the critical areas (patterns). The pre-simulation can be model-based, rule-based, or combination thereof. The wafer simulation of the critical areas is inspected for hot spots. In the depicted embodiment, the pre-filtering process at 220 can be performed at a dimension on mask (DOM) level, and the pre-simulation process at block 230 can be performed on the contour level, thus further filtering out non-risky areas of the OPCed IC design layout 134.

As illustrated in FIG. 4, after the pre-simulation process at block 230 is performed, a smaller number of areas (patterns) of the OPCed IC design layout 134 are identified. The critical areas (patterns) of the OPCed IC design layout 134 can be stored as a significantly smaller file, represented by Lite-OPC 232. This smaller file 232 provides the critical areas/patterns of the OPCed IC design layout 134. The LPC 140 then simulates the critical areas/patterns of the Lite-OPCed design layout and inspects the critical areas/patterns for hot spots. In the depicted embodiment, the pre-simulation process at block 230 can utilize faster, less accurate models than the LPC 140, which can increase cycle time while still effectively detecting areas of the OPCed IC design layout 134 that are at risk for hot spots.

Figure 7:
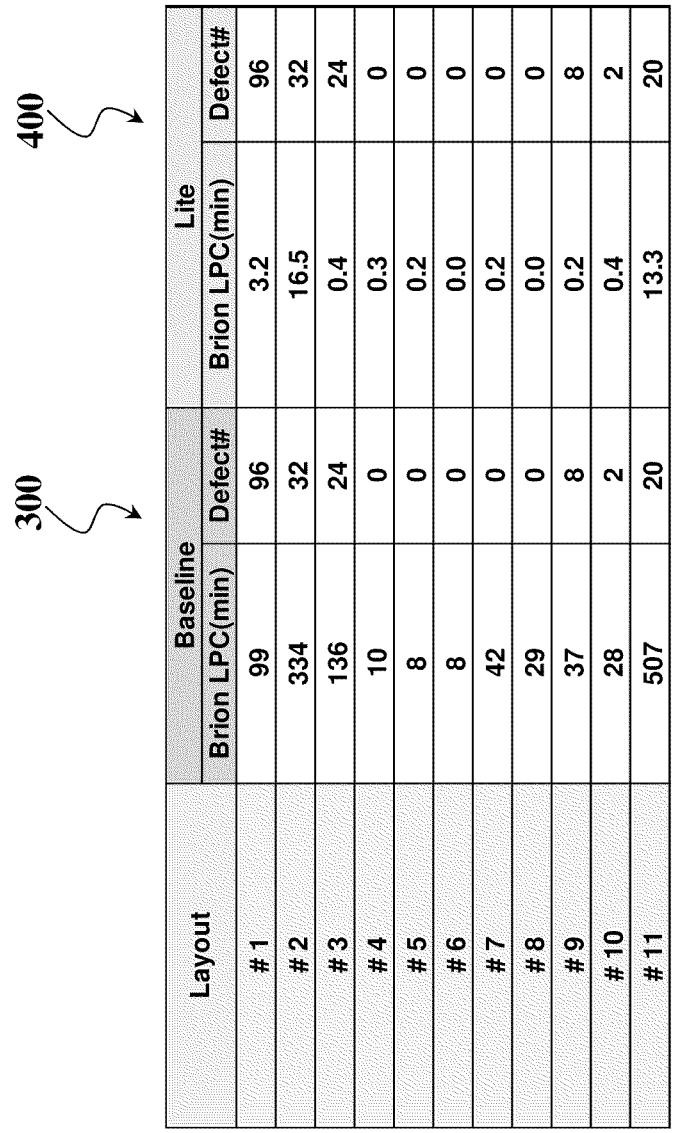
FIG. 7 is a table of experimental results comparing throughput of a conventional lithography process check flow and the lithography process check flow of FIG. 4.

Because the LPC 140 simulates critical areas/patterns of the Lite-OPCed design layout, cycle time can be significantly reduced. For example, FIG. 7 is a table of experimental results comparing a conventional LPC process flow 300 (Baseline), which performs a full IC device simulation, and an LPC process flow 400 (Lite), which implements the improved LPC flow 200 described above and performs a simulation of critical areas of the IC device layout. The LPC-Lite process flow 400 identified the same number of defects (defect #) as the conventional LPC process flow 300 in significantly faster time. From the experimental results, the conventional LPC process flow 300 consumed an average cycle time of about 112.5 minutes. In contrast, the proposed LPC process flow 400 consumed an average cycle time of about 3.1 minutes, approximately 35 times faster than the conventional LPC process flow 300. Thus, it is evident that the LPC-Lite process flow 400 can effectively and efficiently discover hot spots shortly after the OPC process without having to perform a full IC device simulation.

The present disclosure is designed to work on any specific architecture. For example, the mask manufacturing system and method system may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

Furthermore, embodiments of the present disclosure can include one or more databases, which can include any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving an integrated circuit (IC) design layout;
   applying an optical proximity correction (OPC) modification to the IC design layout;
   before performing a lithography process check (LPC), identifying a critical area of the OPC-modified IC design layout, wherein the identifying the critical area of the OPC-modified IC design layout comprises:
   separating the OPC-modified IC design layout into more than one pattern category;
   defining criteria for each pattern category;
   applying the criteria to each pattern category to filter out a first set of critical areas in the OPC-modified IC design layout;
   providing a simulated IC pattern of the first set of critical areas; and
   identifying a second set of critical areas from the simulated IC pattern of the first set of critical areas; and
   applying a lithography process check (LPC) modification to the OPC-modified IC design layout if the critical area of the OPC-modified IC design layout exhibits a hotspot.

2. The method of claim 1 wherein the identifying the critical area of the OPC-modified IC design layout comprises determining areas of the OPC-modified IC design layout that are at risk for hot spots.

3. The method of claim 1 wherein the separating the OPC-modified IC design layout into more than one pattern category comprises identifying one dimensional (1D) and two dimensional (2D) edges of the OPC-modified IC design layout.

4. The method of claim 3 wherein the defining the criteria for each pattern category comprises:
   classifying the 1D edges of the OPC-modified IC design layout into isolated, semi-isolated, or dense lines;
   defining isolated, semi-isolated, and dense line parameters for the classified 1D edges, wherein the isolated, semi-isolated, and dense lines identify 1D edges that are not at risk for hot spots; and
   defining end type parameters for 2D edges of the OPC-modified IC design layout, wherein the end type parameters identify 2D edges that are not at risk for hot spots.

5. The method of claim 1 wherein the applying the LPC modification to the OPC-modified IC design layout if the critical area of the OPC-modified IC design layout exhibits the hot spot comprises:
   simulating an IC manufacturing process to create a simulated IC pattern of the critical area of the OPC-modified IC design layout;
   inspecting the simulated IC pattern of the critical area for hot spots; and
   modifying the critical area of the OPC-modified IC design layout if hot spots are found in the simulated IC pattern of the critical area.

6. The method of claim 5 wherein the simulating the IC manufacturing process comprises simulating a lithography process.

7. The method of claim 5 wherein the inspecting the simulated IC pattern of the critical area for hot spots comprises determining whether the simulated IC pattern of the critical area exhibits necking or bridging.

8. The method of claim 1 further comprising applying logical operation (LOP) and resolution enhancement technique (RET) modifications to the IC design layout.

9. A method comprising:
   receiving an integrated circuit (IC) design layout;
   applying an optical proximity correction (OPC) modification to the IC design layout;
   identifying a first set of critical areas in the OPC-modified IC design layout;
   providing a simulated IC pattern of the first set of critical areas;
   identifying a second set of critical areas from the first set of critical areas; and
   applying a lithography process check (LPC) modification to the OPC-modified IC design layout if the second set of critical areas of the OPC-modified IC design layout exhibit a hotspot.

10. The method of claim 9, wherein the identifying the first set of critical areas in the OPC-modified design layout includes dividing the OPC-modified design layout into a plurality of OPC patterns.

11. The method of claim 10, wherein the identifying the first set of critical areas in the OPC-modified design layout includes defining parameters for each OPC pattern form the plurality of patterns.

12. The method of claim 11, wherein the identifying the first set of critical areas in the OPC-modified design layout includes performing a filtering process for each OPC pattern based on the defined parameters.

13. The method of claim 9, wherein identifying the second set of critical areas from the first set of critical areas includes performing a filtering process of the first set of critical areas based on the simulated IC pattern.

14. The method of claim 13, wherein performing the filtering process of the first set of critical areas based on the simulated IC pattern comprises:
    inspecting the simulated IC pattern of the first set of critical areas for patterns at risk for hot spots; and
    filtering the patterns at risk for spots into the second set of critical areas of the OPC-modified design layout.

15. The method of claim 9, wherein providing the simulated IC pattern of the first set of critical areas comprises simulating an IC manufacturing process to create the simulated IC pattern.

16. A method comprising:
    receiving an integrated circuit (IC) design layout;
    applying an optical proximity correction (OPC) modification to the IC design layout;
    identifying a plurality of patterns from the OPC-modified design layout;
    identifying a first set of critical areas from the plurality of patterns;
    identifying a second set of critical areas from the first set of critical areas; and
    applying a lithography process check (LPC) modification to the OPC-modified IC design layout based on the identified second set of critical areas of the OPC-modified IC design layout.

17. The method of claim 16, wherein the identifying the first set of critical areas in the OPC-modified design layout includes performing a first filtering process for each OPC pattern based on a parameter associated with each pattern from the plurality of patterns.

18. The method of claim 16, further comprising simulating an IC manufacturing process to create a simulated IC pattern the first set of critical areas.

19. The method of claim 18, wherein identifying the second set of critical areas from the first set of critical areas includes performing a second filtering process of the first set of critical areas based on the simulated IC pattern.

20. The method of claim 16, wherein applying the LPC modification to the OPC-modified IC design layout based on the identified second set of critical areas of the OPC-modified IC design layout includes performing a simulation on only the second set of critical areas identified as exhibiting a hot spot.

* * * * *